(12) United States Patent
Goushcha

(10) Patent No.: US 7,875,890 B1
(45) Date of Patent: *Jan. 25, 2011

(54) STRUCTURES AND METHODS TO IMPROVE THE CROSSTALK BETWEEN ADJACENT PIXELS OF BACK-ILLUMINATED PHOTODIODE ARRAYS

(75) Inventor: Alexander O. Goushcha, Aliso Viejo, CA (US)

(73) Assignee: Array Optronix, Inc., Costa Mesa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/541,747

(22) Filed: Aug. 14, 2009

Related U.S. Application Data

(63) Continuation of application No. 11/368,041, filed on Mar. 3, 2006, now Pat. No. 7,576,371.

(51) Int. Cl.
*H01L 31/068* (2006.01)
(52) U.S. Cl. .................. 257/81; 257/E31.057
(58) Field of Classification Search .................. 257/81, 257/E31.057
See application file for complete search history.

(56) References Cited

U.S. PATENT DOCUMENTS

| | | | |
|---|---|---|---|
| 3,574,009 | A | 4/1971 | Chizinsky et al. |
| 4,144,096 | A | 3/1979 | Wada et al. |
| 4,963,971 | A | 10/1990 | Rosetti et al. |
| 5,072,312 | A | 12/1991 | Schwarzbauer et al. |
| 5,075,748 | A | 12/1991 | Hisa |
| 5,538,564 | A | 7/1996 | Kaschmitter |
| 5,670,383 | A | 9/1997 | Piccone et al. |
| 6,111,305 | A | 8/2000 | Yoshida et al. |
| 6,184,100 | B1 | 2/2001 | Arai |
| 6,426,991 | B1 | 7/2002 | Mattson et al. |
| 6,504,178 | B2 | 1/2003 | Carlson et al. |

(Continued)

FOREIGN PATENT DOCUMENTS

EP  0373066  6/1990

(Continued)

OTHER PUBLICATIONS

"New Photodiode Array Products for Computer Tomography-Detectors", *Detection Technology, Inc.*, New Bulletion for the Customers and Cooperation Partners, (Winter 2000-2001).

(Continued)

*Primary Examiner*—Allan R Wilson
(74) *Attorney, Agent, or Firm*—Vierra Magen Marcus & DeNiro LLP

(57) ABSTRACT

Structures and methods to improve the crosstalk between adjacent pixels of back-illuminated photodiode arrays on a substrate having first and second surfaces, including providing a first matrix of regions of a first conductivity type of a higher conductivity than the substrate extending into the substrate from the first surface and surrounding each photodiode of the array, and providing a second matrix of regions of a first conductivity type of a higher conductivity than the substrate extending into the substrate from the second surface, the second matrix being a mirror image of and aligned with the first matrix, the matrices extending into the substrate less than one half the thickness of the substrate so as to not touch each other. The methods and corresponding structures may be applied to p/n diodes, pin diodes, avalanche photodiodes, photoconductive cells (no p-n junction at all), or similar photosensitive device arrays.

5 Claims, 7 Drawing Sheets

U.S. PATENT DOCUMENTS

| | | | |
|---|---|---|---|
| 6,653,164 | B2 | 11/2003 | Miida |
| 6,707,046 | B2 | 3/2004 | Possin et al. |
| 6,762,473 | B1 | 7/2004 | Goushcha et al. |
| 6,777,729 | B1 | 8/2004 | Prince et al. |
| 6,853,046 | B2 | 2/2005 | Shibayama |
| 6,933,489 | B2 | 8/2005 | Fujii et al. |
| 7,112,465 | B2 * | 9/2006 | Goushcha et al. ............ 438/73 |
| 7,148,464 | B2 | 12/2006 | Shibayama |
| 7,242,069 | B2 | 7/2007 | Bui et al. |
| 7,297,927 | B2 | 11/2007 | Carlson et al. |
| 7,375,340 | B2 | 5/2008 | Hietanen et al. |
| 7,408,238 | B2 | 8/2008 | Shibayama |
| 7,417,216 | B2 | 8/2008 | Carlson et al. |
| 7,420,257 | B2 | 9/2008 | Shibayama |
| 7,462,553 | B2 * | 12/2008 | Metzler et al. ............. 438/459 |
| 7,576,369 | B2 | 8/2009 | Bui et al. |
| 7,576,404 | B2 | 8/2009 | Wilson et al. |
| 2002/0000562 | A1 | 1/2002 | Carlson et al. |
| 2002/0011639 | A1 | 1/2002 | Carlson et al. |
| 2002/0020846 | A1 | 2/2002 | Pi et al. |
| 2002/0058353 | A1 | 5/2002 | Merrill |
| 2002/0148967 | A1 | 10/2002 | Iwanczyk et al. |
| 2003/0209652 | A1 | 11/2003 | Fujii et al. |
| 2004/0032026 | A1 | 2/2004 | Yang et al. |
| 2004/0104351 | A1 | 6/2004 | Shibayama |
| 2004/0113185 | A1 * | 6/2004 | Shibayama et al. ......... 257/292 |
| 2004/0129992 | A1 | 7/2004 | Shibayama |
| 2004/0262652 | A1 | 12/2004 | Goushcha et al. |
| 2005/0221541 | A1 * | 10/2005 | Metzler et al. ............. 438/142 |
| 2006/0197188 | A1 | 9/2006 | Fujii et al. |
| 2007/0018212 | A1 * | 1/2007 | Shibayama ................ 257/292 |
| 2007/0085117 | A1 | 4/2007 | Wilson et al. |
| 2007/0111356 | A1 | 5/2007 | Wilson et al. |
| 2007/0241377 | A1 * | 10/2007 | Goushcha et al. ........... 257/292 |
| 2008/0299698 | A1 | 12/2008 | Wilson et al. |

OTHER PUBLICATIONS

"S268P Data Sheet, Silicon PIN Photodiode Array", *Vishay Semiconductors*, Document No. 81538, (May 20, 1999), pp. 1-5.

"Si Photodiode Catalog", *Hamamatsu Photonics K.K., Solid State Division*, (Feb. 2002), pp. 1-25.

Burns, H.N., et al., "Compact, 625-channel scannerless imaging laser radar receiver", *Proc. SPIE.*, vol. 2748, (1996), pp. 39-46.

Derenzo, Stephen E., "Initial Characterization of a BGO-Photodiode Detector for High Resolution Positron Emission Tomography", *IEEE Transactions on Nuclear Science*, vol. NS-31, No. 1, (Feb. 1984), pp. 620-626.

Goushcha, Ilja, et al., "Noise performance and temperature coefficients studies for the back-illuminated, thin silicon pin photodiode arrays", *Proceedings of the SPIE, Semiconductor Photodetectors III, 2006*, vol. 6119, pp. 61190C-1-61190C-9.

Holland, S.E., et al., "Development of Low Noise, Back-Side Illuminated Silicon Photodiode Arrays",*IEEE Transactions on Nuclear Science*, vol. 44, No. 3, (Jun. 1997), pp. 443-447.

Iwanczyk, J.S., et al., "Simulation and modelling of a new silicon X-ray drift detector design for synchrotron radiation applications", *Nuclear Instruments and Methods in Physics Research*, Section A, vol. 380, pp. 288-294.

Kwa, Tommy A., et al., "Backside-Illuminated Silicon Photodoide Array for an Integrated Spectrometer", *IEEE Transactions on Electron Devices*, vol. 44, No. 5, (May 1997), pp. 761-765.

Luhta, Randy, et al., "Back Illuminated Photodiodes for Multislice CT", San Diego, California, USA, (Feb. 15-20, 2003).

Luhta, Randy, et al., "Back Illuminated Photodiodes for Multislice CT: An Estimation of Temporal and Spatial Properties by Carrier Diffusion Modeling", *Proceedings of the SPIE, Medical Imaging 2004: Physics of Medical Imaging*, Bellingham, WA, vol. 5368, pp. 552-563.

Metzler, Richard A., et al., "Ultra-thin, two dimensional, multi-element Si pin photodiode array for multipurpose applications", *Proceedings of the SPIE, Semiconductor Photodetectors 2004*, Belligham, WA, vol. 5353, pp. 117-125.

Patt, B.E., et al., "Fast-Timing Silicon Photodetectors", *IEEE Transactions on Nuclear Science*, vol. 47, No. 3, (Jun. 2000), pp. 957-964.

Patt, B.E., et al., "High Resoluton CsI(T1)/Si-PIN Detector Development for Breast Imaging", *IEEE Transactions on Nuclear Science*, vol. 45, No. 4, (Aug. 1998), pp. 2126-2131.

Tabbert, Bernd, et al., "The structure and physical properties of ultra-thin, multi-element Si pin photodiode arrays for medical imaging applications", *Proceedings of SPIE, Medical Imaging 2005: Physics of Medical Imaging*, Bellingham, WA, vol. 5745, pp. 1146-1154.

Takahashi, Tetsuhiko, et al., "Design of Integrated Radiation Detectors with a-Si Photodiodes on Ceramic Scintillators for use in X-Ray Computed Tomography", *IEEE Transactions on Nuclear Science*, vol. 37, No. 3, (Jun. 1990), pp. 1478-1482.

Tornai, Matrin P., et al., "A novel silicon array designed for intraoperative charged particle imaging", *Medical Physics*, vol. 29, No. 11, (Nov. 2002), pp. 2529-2540.

Yang, Min, et al., "High Speed silicon Lateral Trench Detector on SOI Substrate", *International Electron Devices Meeting*, New York, NY, IEDM Technical Digest, IEEE, US, (Dec. 2-5, 2001), pp. 24.1.1-24.1.4.

* cited by examiner

STRUCTURES AND METHODS TO IMPROVE THE CROSSTALK BETWEEN ADJACENT PIXELS OF BACK-ILLUMINATED PHOTODIODE ARRAYS

CROSS-REFERENCE TO RELATED APPLICATION(S)

This application is a continuation of U.S. patent application Ser. No. 11/368,041 filed Mar. 3, 2006.

BACKGROUND OF THE INVENTION

1. Field of the Invention

The present invention relates to the field of semiconductor photodetectors, and in particular to high performance semiconductor back-illuminated photodiode array structures and methods of fabricating the same.

2. Prior Art

Large-scale, multi-element pin and avalanche photodiode arrays have found their application in many imaging applications. Historically, pin photodiode arrays were first developed as front-side illuminated photodetectors with standard die attach and wire bonding processes. However, growing demands of the larger pixel density and smaller "dead" spaces (gaps) between active elements facilitated design of backside or back illuminated flip-chip structures with virtually unlimited numbers of pixels. See, for instance, S. E. Holland, N. W. Wang, W. W. Moses, "Development of low noise, back-side illuminated silicon photodiode arrays, *IEEE TRANS NUC SCI,* 44, 443-447, 1997, R. Luhta, R. Mattson, N. Taneja, P. Bui and R. Vasbo, "Back Illuminated Photodiodes for Multislice CT", Proc. SPIE 5030, 235-245, 2003, U.S. Pat. Nos. 6,426,991 and 6,707,046, and U.S. Patent Application Publication No. 2002/0009652.

In addition to the obvious advantages of large pixel count and small gaps between pixel active areas, conventional back illuminated photodiode arrays have several drawbacks. In particular, in applications with a low or zero reverse bias, the diffusion term dominates the drift in the non-equilibrium carrier collection, thus producing a noticeable, uncontrolled lateral flow of carriers from the illuminated cell (pixel) to the adjacent cells. This effect might be negligibly small for the front-side illuminated arrays, at least within the wavelength range of the small absorption lengths. In the case of back illuminated arrays, the carriers' lateral diffusion results in a significant electrical crosstalk between pixels (>1%), dramatically deteriorating the arrays' performance.

The carriers' diffusion between adjacent cells could be avoided by etching trenches between active elements. However, this method weakens the mechanical integrity of dies, creating additional problems in designing and fabricating thin photodiode arrays.

An alternative solution proposed recently suggests building the structure with isolated diffusion walls between active elements that span the whole thickness of the die. See, for instance, U.S. Pat. No. 6,762,473 and R. A. Metzler, A. O. Goushcha, C. Hicks, and E. Bartley. Ultra-thin, two dimensional, multi-element Si pin photodiode array for multipurpose applications. In: Semiconductor Photodetectors 2004, *Proceedings of SPIE,* 5353 (SPIE Bellingham, Wash., 2004), 117-125. Such an approach makes the crosstalk negligible (<0.01%), but requires a considerable thermal budget to make a through isolating diffusion between the front side and the backside of the wafer.

Conventional photodiode array structures are based on either the front illuminated or back illuminated ideology.

FIG. 1 illustrates a simplified front illuminated photodiode arrays cross-section. Note that the oxide layers are not shown in this Figure. On a substrate 1, either n-type or p-type material, the opposite polarity diffusion 2 is made, creating thereby either p-on-n (p-i-n) or n-on-p (n-i-p) structure, respectively. The anode metal pads 3 for the p-on-n structure (the cathode contacts for the n-on-p structure) are always on the device front surface. The opposite polarity electrode is usually deposited on the chip backside in the case of the front illuminated structure (see 4, FIG. 1). The blanket-type doping 5 on the back surface of the die with the dopant of the same polarity as the majority carriers of the substrate crystal is applied to improve both the charge collection efficiency and DC/AC electrical performance of the devices.

For a back-illuminated structure, the simple design shown in the cross section of FIG. 2 is widely used, with the thickness of the wafer of the first conductivity type anywhere from ~10 um to ~500 um. The p/n junction is formed by the shallow diffusion of the dopant of the second conductivity type (see 2 in FIG. 2), and corresponding electrodes are fabricated on the top (see 3 in FIG. 2). The shallow diffusion 6 is made with the dopant of the first conductivity type to provide a good contact to the substrate bulk and to decrease the crosstalk between the adjacent elements. Dummy cell diffusions of the same polarity as the diffusion 2 in FIG. 2 can be placed between active cells to decrease the crosstalk.

Note that similar structures (like diffusion 6 in FIG. 2 and additional dummy cells) are usually used to improve the crosstalk and other performance parameters for the front-illuminated photodiode arrays also.

The back-illuminated photodiode array design proposed recently is characterized with almost zero electrical crosstalk between adjacent pixels due to the isolation diffusion walls that span the whole substrate between the front- and backside of the die (see 7 in FIG. 3). See also, U.S. Pat. No. 6,762,473, R. A. Metzler, A. O. Goushcha, C. Hicks, and E. Bartley. Ultra-thin, two dimensional, multi-element Si pin photodiode array for multipurpose applications. In: Semiconductor Photodetectors 2004, *Proceedings of SPIE,* 5353 (SPIE Bellingham, Wash., 2004), 117-125, and Tabbert, B., Hicks, C., Bartley, E., Wu, H., Goushcha, I., Metzler, R. A., and Goushcha, A. O. The structure and physical properties of ultra-thin, multi-element Si pin photodiode arrays for medical imaging applications. In: Medical Imaging 2005: Physics of Medical Imaging, *Proceedings of SPIE,* 5745 (SPIE Bellingham, Wash., 2005), 1146-1154. Note that this isolation diffusion is made of the dopant of the conductivity type opposite to that of the diffusion 2 in FIG. 3, i.e., the same conductivity type as the substrate.

DETAILED DESCRIPTION OF THE PREFERRED EMBODIMENTS

This invention comprises structures and methods that considerably reduce the electrical crosstalk for back lighted photodiode arrays (pin, avalanche, and other types of multiple-pixel semiconductor photo detectors) built on the wafers of any size and thickness while applying a relatively small thermal budget.

Figure 5:
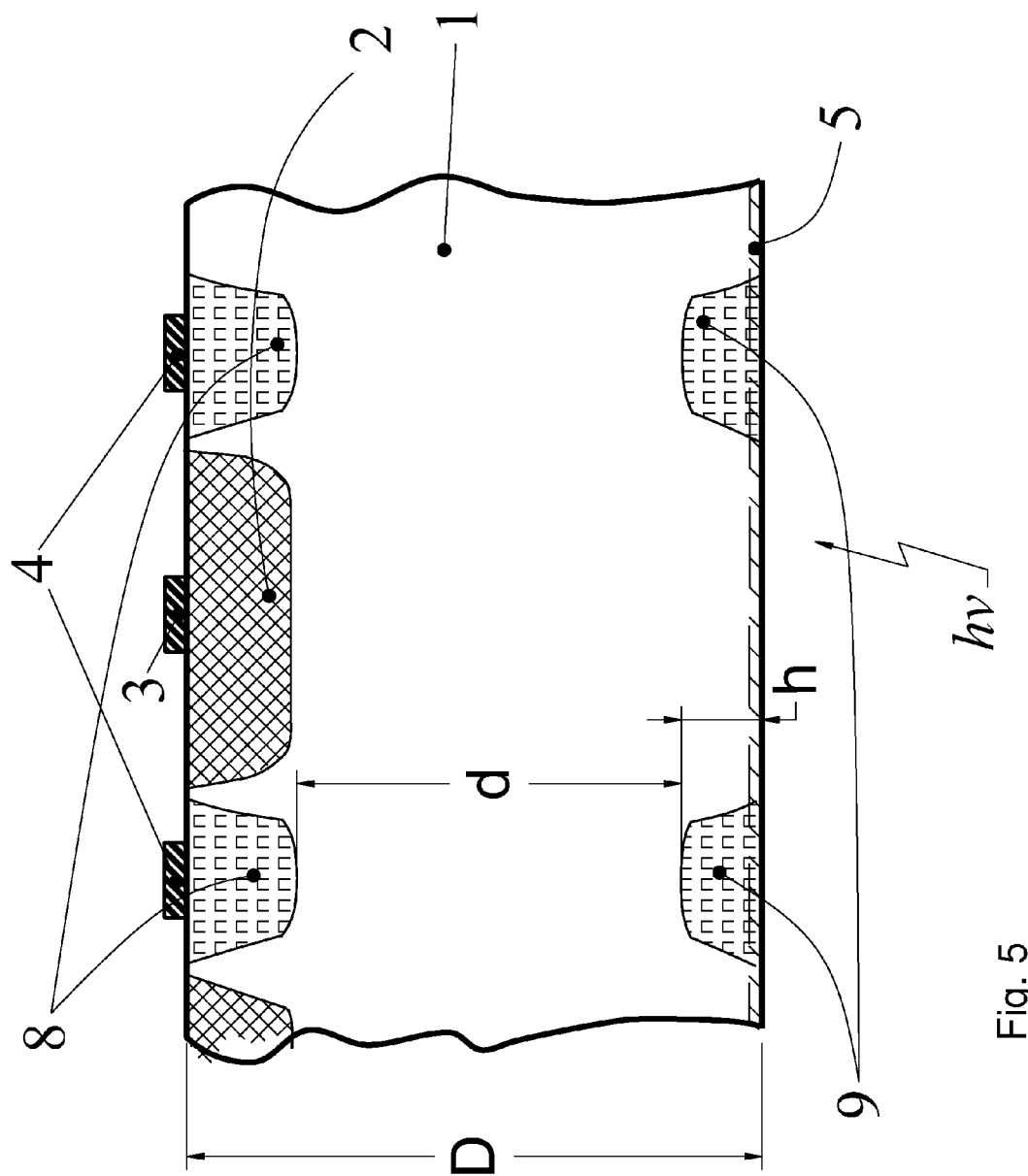
FIG. 5 is a simplified schematic cross section of the multi-pixel photodiode array structure of one embodiment of the present invention. The structure is characterized with low electrical crosstalk between adjacent elements and is almost as simple in fabrication as the structures shown in FIGS. 1 and 2.

Among the objectives of the present invention are:

1) To provide multiple element, back illuminated 2D-photodetector arrays with superior properties, including the electrical crosstalk between adjacent pixels;

To indicate critical parameters and give estimations for their values to improve the electrical crosstalk for back illuminated photodetector arrays built in accordance with the structure shown in FIG. 5.

It is therefore one object of this invention to provide structures for silicon multi-element, 2-dimensional photodiode arrays that can greatly improve characteristics, primarily the electrical crosstalk, of most currently existing photodiode arrays, making it useful in many imaging applications.

FIG. 5 is a simplified cross-section of a semiconductor photodiode array in accordance with the present invention. Note that as further discussed herein, each pixel can be one of the following: p/n diode, pin diode, avalanche photodiode, photoconductive cell (no p-n junction at all), or similar photosensitive device arrays. The structure is built using either n-type or p-type bulk semiconductor 1. For brevity, we will further refer to the anode in the case of p-on-n structure or the cathode in the case of n-on-p structure as "the first electrode", while the cathode in the case of p-on-n structure and the anode in the case of n-on-p structure will be referred to as "the second electrode". The material resistivity, thickness of the wafer/die, dopant concentrations and doses, and diffusion conditions are chosen in a standard way to satisfy the best performance requirements.

An example of a real structure built using an n-type bulk Si with a resistivity of ~500 Ωcm is shown schematically in FIG. 5.

The first electrode diffusion 2 of the opposite conductivity type from the substrate may or may not overlap with the second electrode diffusion 8 close to the front surface of the die, as shown in FIG. 5.

Figure 7:
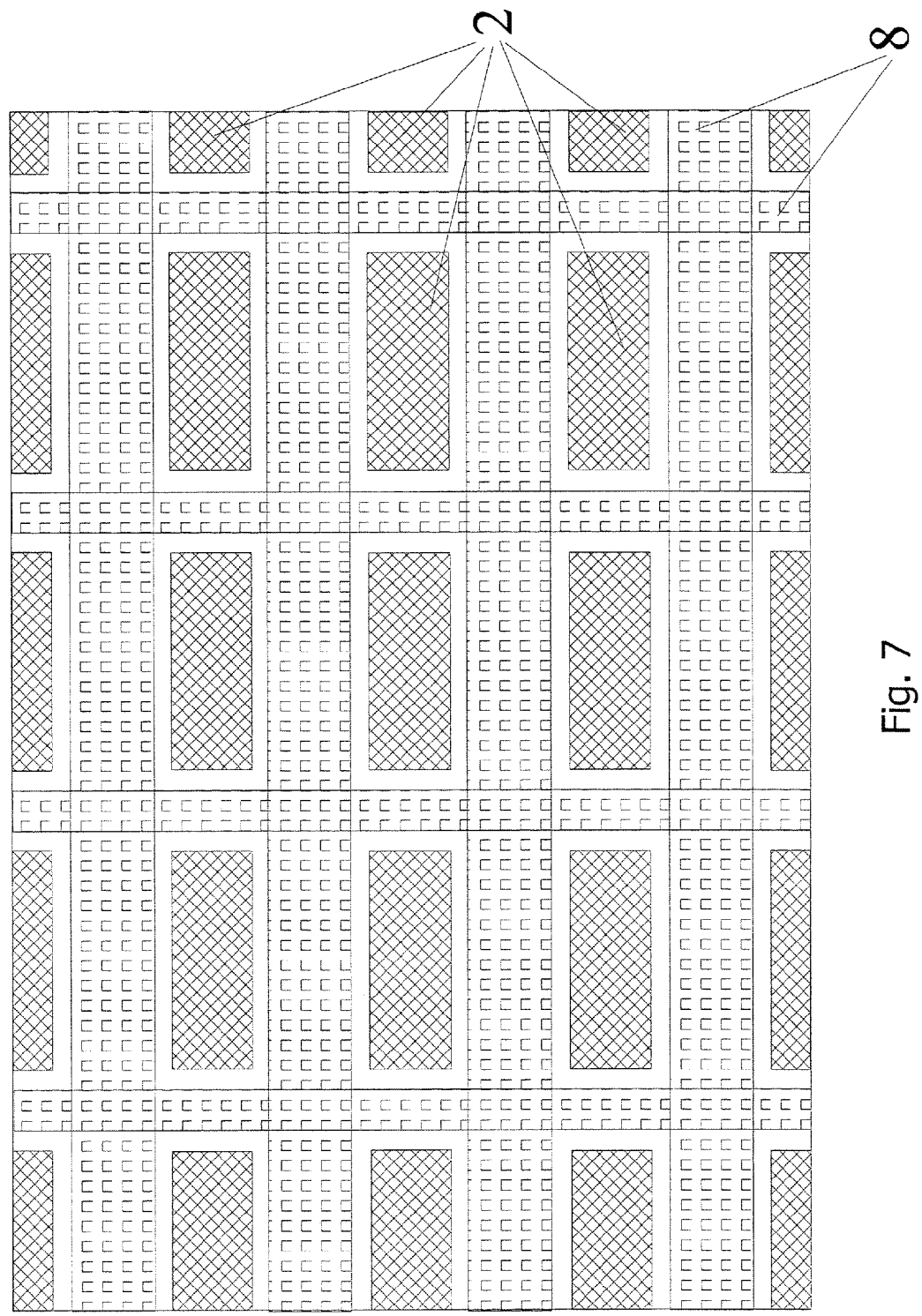
FIG. 7 is a view of a sample array from the first surface within embodiments of this invention.

Diffusion 2 may form a matrix of rectangular-shaped elements interspersed within the matrix of the first conductivity type diffusions 8, as shown in FIG. 7.

The second electrode diffusion of the same conductivity type as the substrate is made from the front side (region 8) and the backside of the die (region 9) in FIG. 5. A blanket diffusion 5 of the same conductivity type as the substrate and regions 8 and 9 covers the backside of the array.

The diffusion depth h can be small to leave a considerable volume of the total die thickness free of any dopant (in other words, the distance between the front and backside diffusion edges d in FIG. 5 can be very close to the die thickness value D). The depth h of the second electrode diffusion depends on the required performance parameters (crosstalk value, speed, noise, etc). As to the crosstalk, for a given depth h, the crosstalk depends on light wavelength and the absorption length for that particular wavelength and is specific for each semiconductor. Generally, the smaller the absorption length and the thinner the die thickness D, the smaller the electrode diffusion depth h could be to minimize the crosstalk. Also the higher the dopant concentration of the diffusion 9, the better the crosstalk performance is for the same diffusion depth of the second electrode. Note that the crosstalk dependence on the separation distance between adjacent cells is not discussed here. In general, the larger this distance, the smaller the crosstalk value is.

Figure 1:
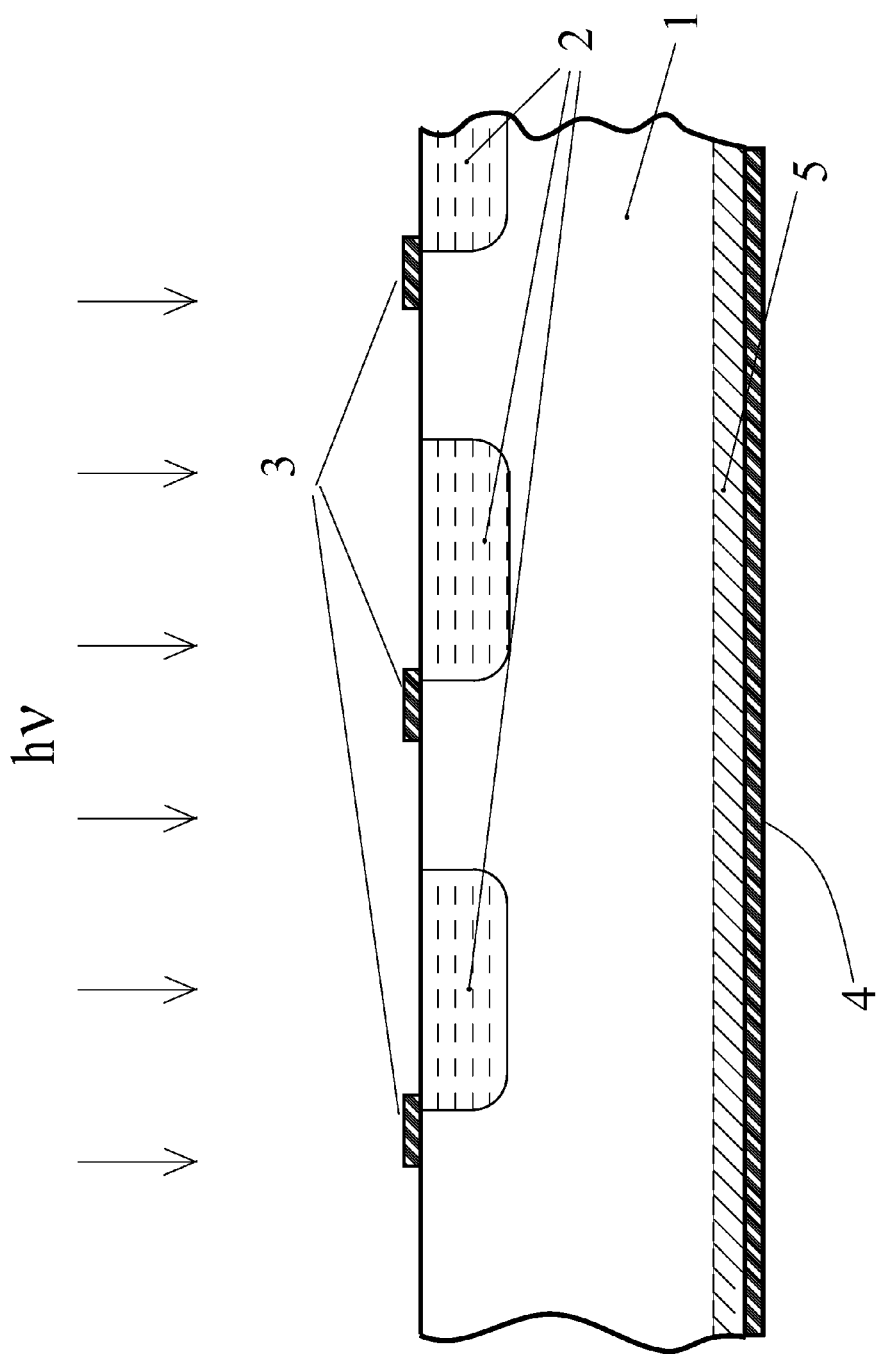
FIG. 1 is a simplified cross section of a prior art front-illuminated pin photodiode array characterized by large electrical crosstalk between adjacent elements.
Figure 2:
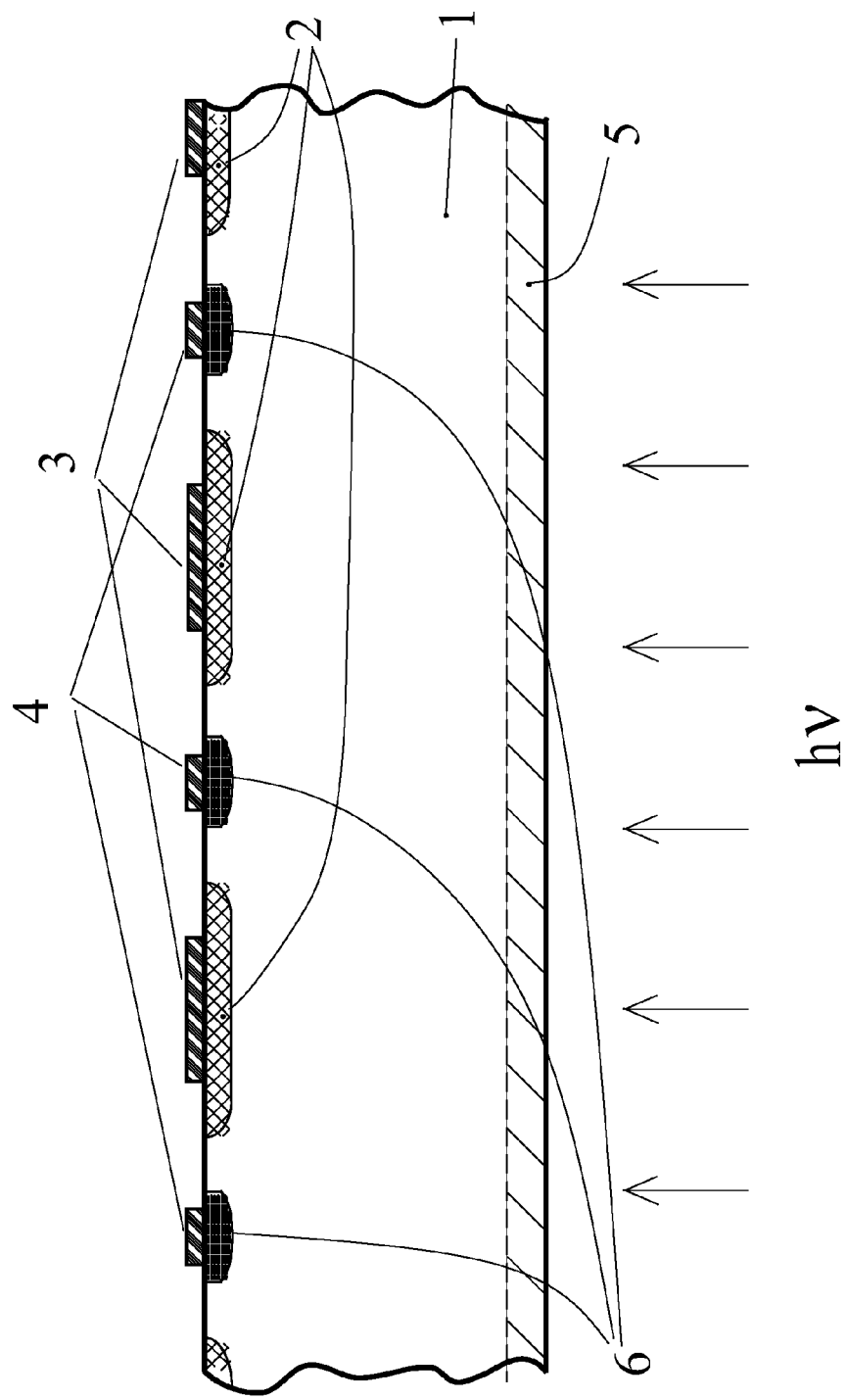
FIG. 2 is a simplified cross section of a prior art back illuminated photodiode array that is also characterized by large electrical crosstalk between adjacent elements.
Figure 3:
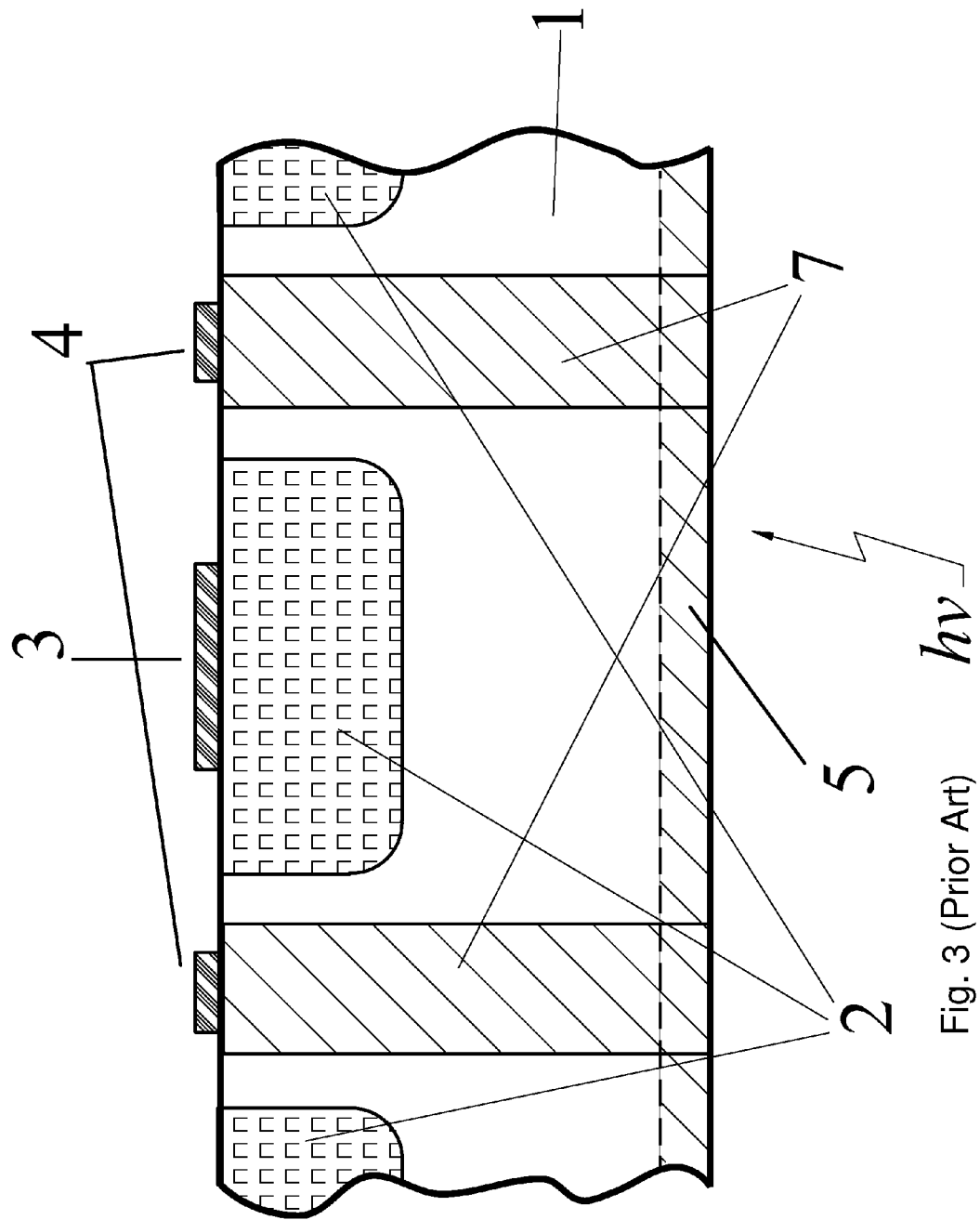
FIG. 3 is a simplified schematic cross section of the back illuminated photodiode array in accordance with U.S. Pat. No. 6,762,473 and International Application No. PCT/US2004/20835. This structure is characterized by almost zero electrical crosstalk between adjacent elements, but requires a significant thermal budget for fabrication.
Figure 4:
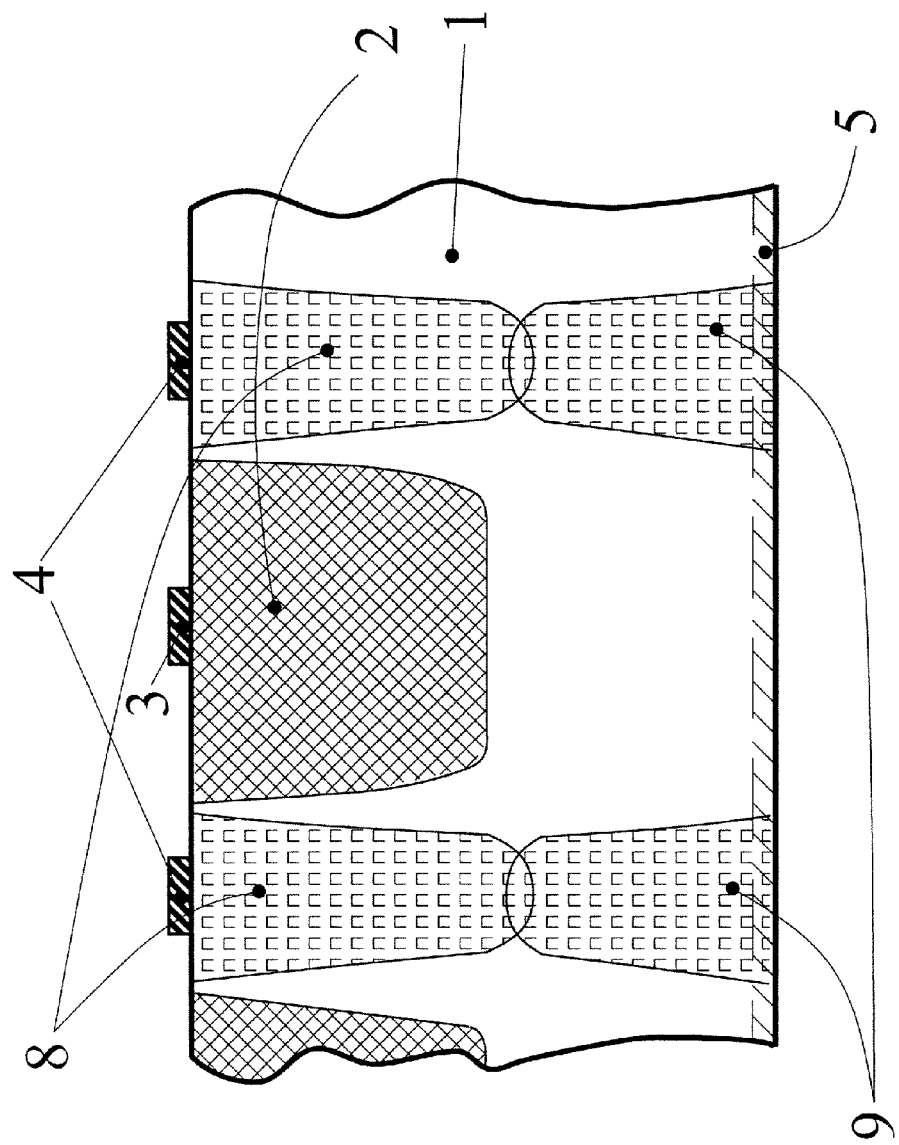
FIG. 4 is a simplified cross section illustrating one prior art method to prepare the structure illustrated in FIG. 3.

Consider an example of the array with a given separation distance between the adjacent pixels. For the array structure shown in FIGS. 3 and 4, the AC and DC crosstalk value can be as small as <0.01% for the cases when the illuminated cell is either open or shorted. The term "shorted" cell is used here to describe the situation when the anode and cathode of the pixel are connected to each other, whereas the term "open" cell refers to the case of the anode and cathode of the pixel not being connected. In contrast, the back-illuminated array structure shown in FIG. 2 is usually characterized with the crosstalk value of several tenths of a percent for the case when the illuminated cell is shorted or several percent for the case of an open cell.

Applying the region of the second electrode diffusion from the backside (region 9 in FIG. 5) allows to reduce the crosstalk value from ≈1% to <0.01% by decreasing the distance d between the regions 8 and 9 from ≈D to 0.

As previously mentioned, each pixel can be one of the following: p/n diode, pin diode, avalanche photodiode, photoconductive cell (no p-n junction at all), or similar photosensitive device arrays. In that regard, note that although the substrate is usually not an intrinsic material, a diode array with a high resistivity p or n-type substrate may be referred to as a p-i-n diode. Thus the structure described is applicable to both p/n and p-i-n photodiodes.

Figure 6:
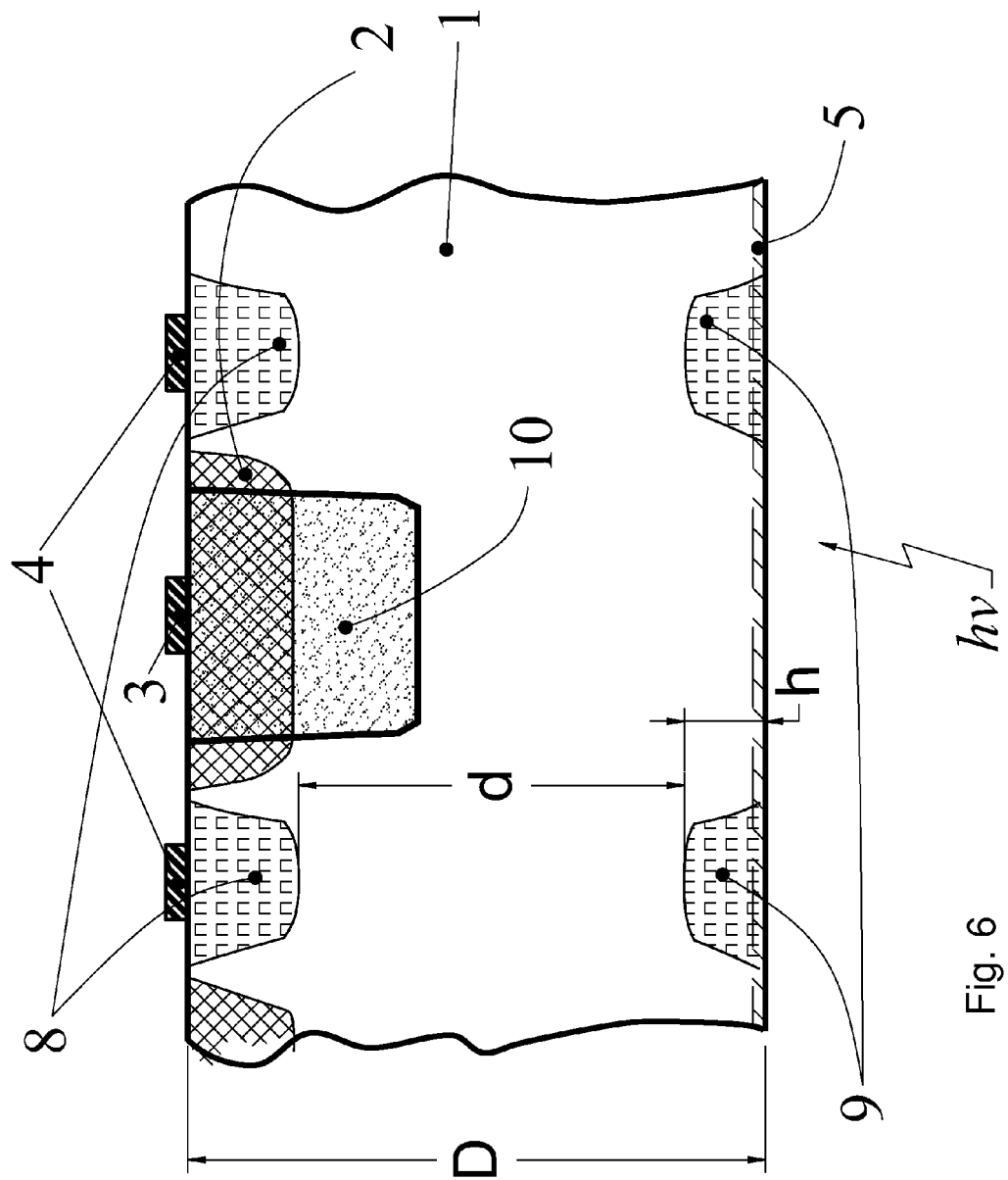
FIG. 6 shows a cross section of the avalanche photodiode array of another embodiment of the present invention.

Similar considerations can be applied to the avalanche photodiodes, which have an additional diffusion (avalanche multiplication region 10) that may partially overlap with the diffusion region 2, as shown in FIG. 6. Note that the crosstalk reduction due to the isolating diffusions 8 and 9 for avalanche photodiode arrays is not as effective as it is for pin photodiode arrays because avalanche photodiodes (APD) usually operate under the complete depletion conditions (reach-through structures). However, isolating diffusions 8 and 9 can still be very useful for many APD arrays since they allow decreasing the crosstalk for the case of open cells—when the metal pad 3 has no connection to the downstream electronics (the situation that might be typical for the high density arrays). As to the photoconductive cells, they do not have diffusion regions 2. However, the present invention is applicable to such devices, as the combination of regions 8 and 9 provide a guard ring to limit crosstalk in any of these types of photodiode arrays.

A structure like shown in FIG. 5 can be especially useful in fabrication of the thin photodiode array (with the die thickness <=200 um, or even <120 um) where highly desirable results may be obtained without having to diffuse from one or both sides of the substrate to provide a guard ring all the way through the substrate. Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A method of fabrication of a photodiode array on a silicon substrate having first and second surfaces comprising:
   providing a first matrix of regions of a first conductivity type of a higher conductivity than the substrate extending into the substrate from the first surface and surrounding each photodiode of the array;
   providing a plurality of regions of a second conductivity type interspersed within the first matrix of regions of the first conductivity type;
   providing a second matrix of regions of a first conductivity type of a higher conductivity than the substrate extending into the substrate from the second surface, the second matrix being aligned with the first matrix, the first and second matrices extending into the substrate but not touching each other; and,
   providing a plurality of contacts on the first surface for making electrical contact to the first matrix of regions of the first conductivity type and the plurality of regions of the second conductivity type.

2. The method of claim 1 wherein the substrate provided is an n-type silicon substrate having a resistivity of approximately 500 ohm-cm.

3. The method of claim 1 wherein the substrate has a thickness of less than approximately 200 μm.

4. The method of claim 1 wherein the substrate has a thickness of less than approximately 120 μm.

5. A back illuminated photodiode array comprising:
   a substrate of a first conductivity type having first and second surfaces;
   a first matrix of regions of a first conductivity type of a higher conductivity than the substrate extending into the substrate from the first surface of the substrate;
   a plurality of regions of a second conductivity type interspersed within the matrix of regions of the first conductivity type, extending into the substrate from the first surface, each region of the second conductivity type being within a respective region defined by the first matrix of regions of a first conductivity type;
   a second matrix of regions of the first conductivity type of a higher conductivity than the substrate extending into the substrate from the second surface of the substrate and aligned with the first matrix, the first and second matrices not extending into the substrate to touch each other;
   the second surface of the substrate having a layer of the first conductivity type having a greater conductivity than the substrate; and,
   a plurality of contacts on the first surface for making electrical contact to the first matrix of regions of the first conductivity type and the plurality of regions of the second conductivity type;
   there being no electrical contact to the second matrix of regions of a first conductivity type or to the layer of the first conductivity type having a greater conductivity than the substrate on the second surface of the substrate other than through the substrate itself.

* * * * *